United States Patent
Wang et al.

(10) Patent No.: US 8,919,427 B2
(45) Date of Patent: Dec. 30, 2014

(54) LONG-ACTING HEAT PIPE AND CORRESPONDING MANUFACTURING METHOD

(75) Inventors: Cheng-Tu Wang, Taipei (TW);
Pang-Hung Liao, Taipei (TW);
Kuo-Feng Tseng, Taipei (TW);
Wen-Tsai Chang, Taipei (TW)

(73) Assignee: Chaun-Choung Technology Corp., Taipei (TW)

( * ) Notice: Subject to any disclaimer, the term of this patent is extended or adjusted under 35 U.S.C. 154(b) by 1774 days.

(21) Appl. No.: 12/106,420

(22) Filed: Apr. 21, 2008

(65) Prior Publication Data

US 2009/0260793 A1    Oct. 22, 2009

(51) Int. Cl.
| F28D 15/00 | (2006.01) |
| F23P 15/26 | (2006.01) |
| F28D 15/02 | (2006.01) |
| F28D 15/04 | (2006.01) |
| F28F 1/02 | (2006.01) |
| H01L 23/427 | (2006.01) |

(52) U.S. Cl.
CPC ............. *B23P 15/26* (2013.01); *F28D 15/025* (2013.01); *F28D 15/046* (2013.01); *F28F 1/022* (2013.01); *H01L 23/427* (2013.01); *B23P 2700/09* (2013.01)
USPC .................................. 165/104.26; 165/104.21

(58) Field of Classification Search
USPC ............... 165/104.21, 104.26; 29/890.032
See application file for complete search history.

(56) References Cited

U.S. PATENT DOCUMENTS

| 3,414,475 | A | * | 12/1968 | Fiebelmann | 165/104.26 |
| 3,666,005 | A | * | 5/1972 | Moore, Jr. | 165/104.26 |
| 3,700,028 | A | * | 10/1972 | Noren | 165/104.26 |
| 3,714,981 | A | * | 2/1973 | Noren | 165/104.26 |
| 3,750,745 | A | * | 8/1973 | Moore, Jr. | 165/104.26 |
| 3,901,311 | A | * | 8/1975 | Kosson et al. | 165/104.26 |
| 3,913,664 | A | * | 10/1975 | Roukis et al. | 165/104.26 |
| 4,019,571 | A | * | 4/1977 | Kosson et al. | 165/104.26 |
| 4,058,159 | A | * | 11/1977 | Iriarte | 165/104.26 |
| 4,351,388 | A | * | 9/1982 | Calhoun et al. | 165/104.26 |
| 4,422,501 | A | * | 12/1983 | Franklin et al. | 165/104.26 |
| 4,515,207 | A | * | 5/1985 | Alario et al. | 165/104.26 |
| 4,583,587 | A | * | 4/1986 | Alario et al. | 165/104.26 |
| 4,807,697 | A | * | 2/1989 | Gernert et al. | 165/104.26 |
| 4,846,263 | A | * | 7/1989 | Miyazaki et al. | 165/104.26 |
| 4,890,668 | A | * | 1/1990 | Cima | 165/104.25 |
| 4,903,761 | A | * | 2/1990 | Cima | 165/104.25 |
| 4,917,177 | A | * | 4/1990 | Gernert | 165/104.26 |
| 4,934,160 | A | * | 6/1990 | Mueller | 165/104.26 |
| 5,360,058 | A | * | 11/1994 | Koeppl et al. | 165/104.26 |
| 5,579,828 | A | * | 12/1996 | Reed et al. | 165/104.21 |
| 5,771,967 | A | * | 6/1998 | Hyman | 165/104.26 |

(Continued)

FOREIGN PATENT DOCUMENTS

TW    200720614    6/2007

*Primary Examiner* — Ljiljana Ciric
(74) *Attorney, Agent, or Firm* — Chun-Ming Shih; HDLS IPR Services

(57) ABSTRACT

A heat pipe includes a metal tube, a heat-absorption part, a capillary and working fluid. The metal tube has a chamber formed therein. A vapor channel and a liquid channel communicating with the vapor channel are formed in the chamber. The heat-absorption part corresponds to a portion of the vapor channel and the liquid channel. The capillary is arranged in the vapor channel and in the liquid channel of the heat-absorption part. The working fluid fills the chamber.

10 Claims, 8 Drawing Sheets

(56) References Cited

U.S. PATENT DOCUMENTS

| | | | |
|---|---|---|---|
| 6,293,333 B1* | 9/2001 | Ponnappan et al. | 29/890.032 |
| 6,330,907 B1* | 12/2001 | Ogushi et al. | 165/104.26 |
| 6,382,309 B1* | 5/2002 | Kroliczek et al. | 165/104.26 |
| 6,508,302 B2* | 1/2003 | Ishida et al. | 165/104.26 |
| 6,564,860 B1* | 5/2003 | Kroliczek et al. | 165/104.26 |
| 6,725,910 B2* | 4/2004 | Ishida et al. | 165/104.26 |
| 7,445,039 B2* | 11/2008 | Hou et al. | 165/104.26 |
| 7,461,450 B2* | 12/2008 | Lin et al. | 29/890.032 |
| 7,845,394 B2* | 12/2010 | Chang et al. | 165/104.26 |
| 7,866,373 B2* | 1/2011 | Hou et al. | 165/104.26 |
| 2003/0141045 A1* | 7/2003 | Oh et al. | 165/104.26 |
| 2003/0178184 A1* | 9/2003 | Kroliczek et al. | 165/104.26 |
| 2004/0188067 A1* | 9/2004 | Chau et al. | 165/104.26 |
| 2005/0230085 A1* | 10/2005 | Valenzuela | 165/104.26 |
| 2005/0252643 A1* | 11/2005 | Kroliczek et al. | 165/104.26 |
| 2006/0086482 A1* | 4/2006 | Thayer et al. | 165/104.26 |
| 2007/0089864 A1* | 4/2007 | Chang et al. | 165/104.26 |
| 2007/0107875 A1* | 5/2007 | Lee et al. | 165/104.26 |
| 2007/0107877 A1* | 5/2007 | Hou et al. | 165/104.26 |
| 2007/0107878 A1* | 5/2007 | Hou et al. | 165/104.26 |
| 2007/0114008 A1* | 5/2007 | Hou et al. | 165/104.26 |
| 2007/0193723 A1* | 8/2007 | Hou et al. | 165/104.26 |
| 2007/0295485 A1* | 12/2007 | Liu et al. | 165/104.26 |

\* cited by examiner

LONG-ACTING HEAT PIPE AND CORRESPONDING MANUFACTURING METHOD

BACKGROUND

1. Field of the Invention

The present invention relates to a heat pipe, and more specifically, to a long-acting heat pipe and a corresponding manufacturing method.

2. Description of the Related Art

With the operation speed of CPU (central processing unit) of computer increasing continuously, heat generated from the CPU is increased also. Conventional heat-dissipating devices composed of aluminum extruded heat sinks and fans do not satisfy needs of the current CPU. Thus heat pipes with higher thermal conductivity are designed gradually by manufacturers. The heat pipes cooperate with the heat sinks for solving effectively current heat-dissipating problems. However, the heat-conducting speed and the thermal conductivity of the heat pipes are greatly limited by the inner structure and the amount of working fluid thereof. If having excessive working fluid filled thereinto, vapor channel of the heat pipes will be decreased to greatly limit the thermal conductivity thereof. If having less working fluid, the heat pipes are trend to be dried out and damaged. Therefore, the present inventions improve the conventional heat pipes and the corresponding manufacturing methods based upon the above reasons.

A typical heat pipe having a vapor channel and a liquid channel, which is disclosed in TW Patent Publication No. 200720614, includes a metal tube, a capillary, working fluid, and a vapor-liquid two phases shunt board. The capillary is configured for forming at least two chambers spaced to each other in the metal tube. The working fluid is filled in the metal tube. The vapor-liquid two-phases shunt board is arranged on a surface of the capillary arranged in the middle of the metal tube, and the surface of the capillary faces toward the chambers.

However, although the typical heat pipe having the vapor channel and the liquid channel includes the vapor channel and the liquid channel separated from the vapor channel, the vapor channel is formed in the periphery of the liquid channel. If one end of the heat pipe is heated, the vapor flowing direction and the liquid reflowing direction in the heat-absorption part are opposite to those in the heat-dissipation part. Thus the vapor moving upwards and the liquid moving downwards disturb to each other, to decrease the thermal conductivity thereof. Furthermore, the heat pipe transmits the liquid from the heat-dissipation part to the heat-absorption part by the capillary action of the capillary, thus the thermal conductivity thereof will be decreased with increasing the transmitting length.

Furthermore, the method for manufacturing the typical heat pipe, coats the capillary around the shunt board, inserts the above compositive structure into the metal tube, then fills the working fluid into the metal tube, and finally degasses and seals the metal tube. However, the outer diameter of the heat pipe is generally small, thus it is difficult to coat the capillary around the shunt board. It is more difficult to insert the above compositive structure into the metal tube to contact with the inner surface of the metal tube. The typical heat pipe and the corresponding manufacturing method should be improved.

BRIEF SUMMARY

An object of the present invention is to provide a long-acting heat pipe and a corresponding manufacturing method.

The present invention forms a vapor channel and a liquid channel in a metal tube, and transmits cooled liquid from the liquid channel to one end of the heat-absorption part by vapor, thus may avoid drying out the heat pipe, increase greatly the virtual working length of the heat pipe, avoid the limit by the capillary force of the capillary, improve the heat-conducting speed and the thermal conductivity of the heat pipe, and increase the yield rate for manufacturing the heat pipe.

A long-acting heat pipe in accordance with the present invention is provided.

The heat pipe includes a metal tube, a heat-absorption part, a capillary, and working fluid. The metal tube has a chamber formed therein. A vapor channel and a liquid channel communicating with the vapor channel are formed in the chamber. The heat-absorption part corresponds to a portion of the vapor channel and the liquid channel. The capillary is arranged in the vapor channel and in the liquid channel of the heat-absorption part. The working fluid fills the chamber.

A method for manufacturing a long-acting heat pipe in accordance with the present invention is provided. The method includes:

a) providing a metal tube having a vapor channel and a liquid channel communicated with the vapor channel therein;

b) sealing an end of the metal tube by a welding device;

c) inserting a mandrel into the vapor channel and defining a gap between an outer surface of the mandrel and the vapor channel;

d) filling metal powder into the gap and the liquid channel;

e) sintering the metal powder to form a capillary arranged in the vapor channel and the liquid channel;

f) taking out the mandrel; and g) filling working fluid into the metal tube, and degassing and sealing the metal tube.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Reference will now be made to the drawings to describe exemplary embodiments of the present writing data method, in detail. The following description is given by way of example, and not limitation.

Figure 1:
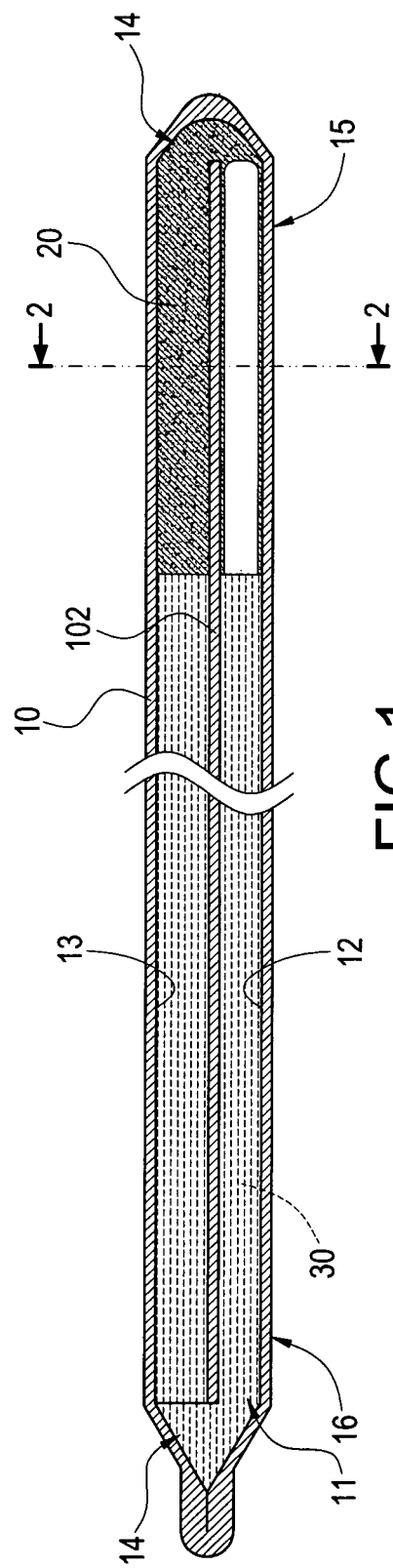
FIG. 1 is a schematic, sectional view of a heat pipe of the present invention.
Figure 2:
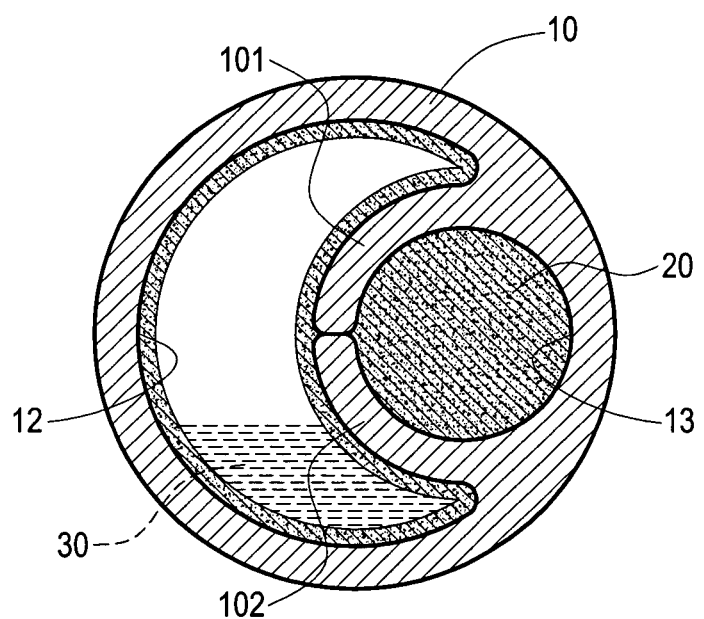
FIG. 2 is a schematic, sectional view of the heat pipe along 2-2 in FIG. 1.

FIGS. 1 and 2 are respectively, a schematic, sectional view of a heat pipe of the present invention and a schematic, sectional view along a line 2-2 of FIG. 1. The present invention provides a long-acting heat pipe. The long-acting heat pipe includes a metal tube 10, a heat-absorption part 15, a heat-dissipation part 16, a capillary 20 and working fluid 30. The metal tube 10 has a chamber 11 defined therein. A vapor channel 12 and a liquid channel 13 communicating with the vapor channel 12 are formed in the chamber 11. In this exemplary embodiment, the length of the liquid channel 13 is shorter than the length of the vapor channel 12, thus connecting areas 14 are formed at the front and back ends of the vapor channel 12 respectively. The heat-absorption part 15 and the heat-dissipation part 16 correspond to the back part and the front part of the vapor channel 12 and the liquid channel 13 respectively. The capillary 20 may be a porous sintered metal, and be arranged in the vapor channel 12 and the liquid channel 13 of the heat-absorption part 15. The vapor channel 12 of the heat-absorption part 15 is surrounded partly by the capillary 20 to form a hollow portion. The liquid channel 13 of the heat-absorption part 15 is fully filled with capillary 20 to form a solid structure for preventing the vapor from flowing therethrough. The working fluid 30 may be pure water, etc., and be contained in the chamber 11.

Figure 3:
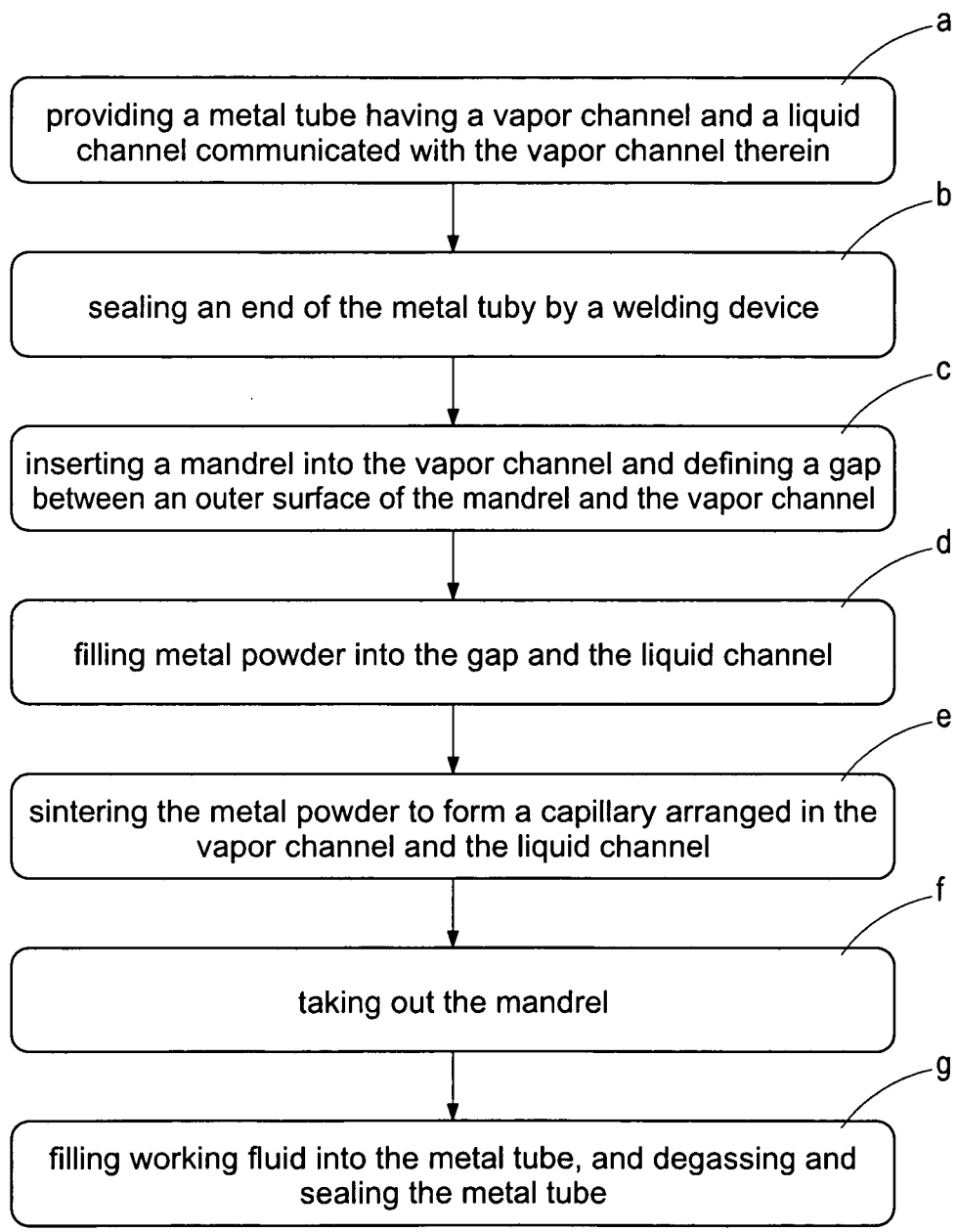
FIG. 3 is a manufacturing flow chart of the heat pipe of the present invention.
Figure 4:
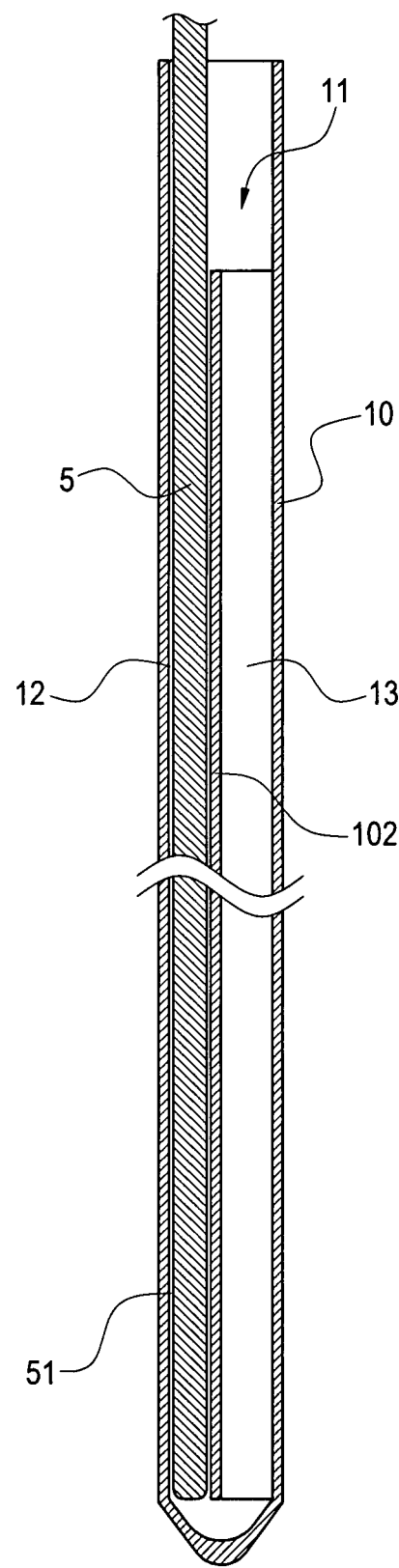
FIG. 4 is a schematic, sectional view of the heat pipe based on a mandrel inserted into a vapor channel.
Figure 5:
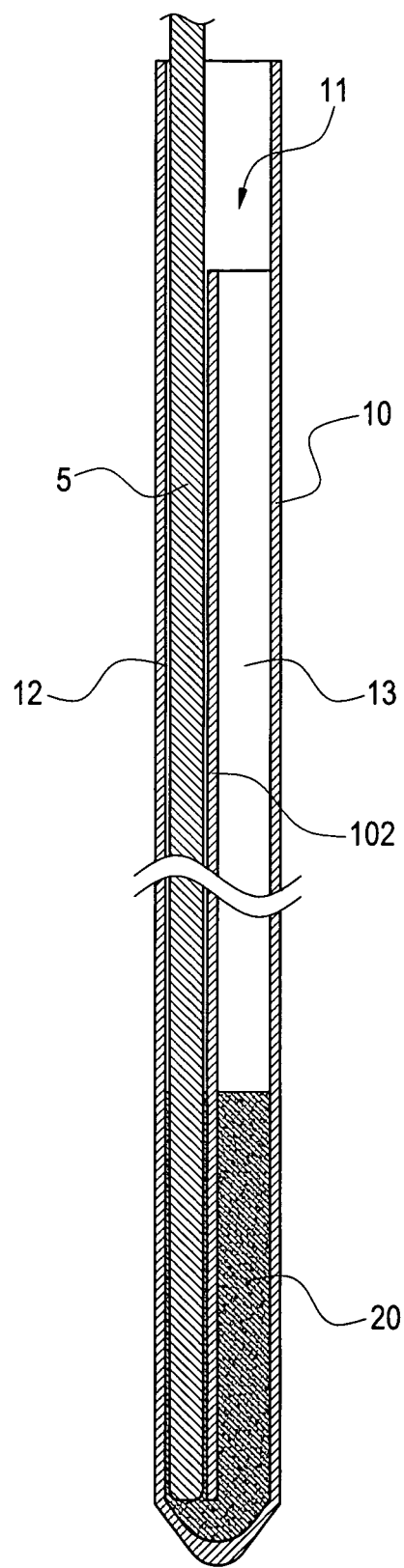
FIG. 5 is a schematic, sectional view of the heat pipe after a sintering process.
Figure 6:
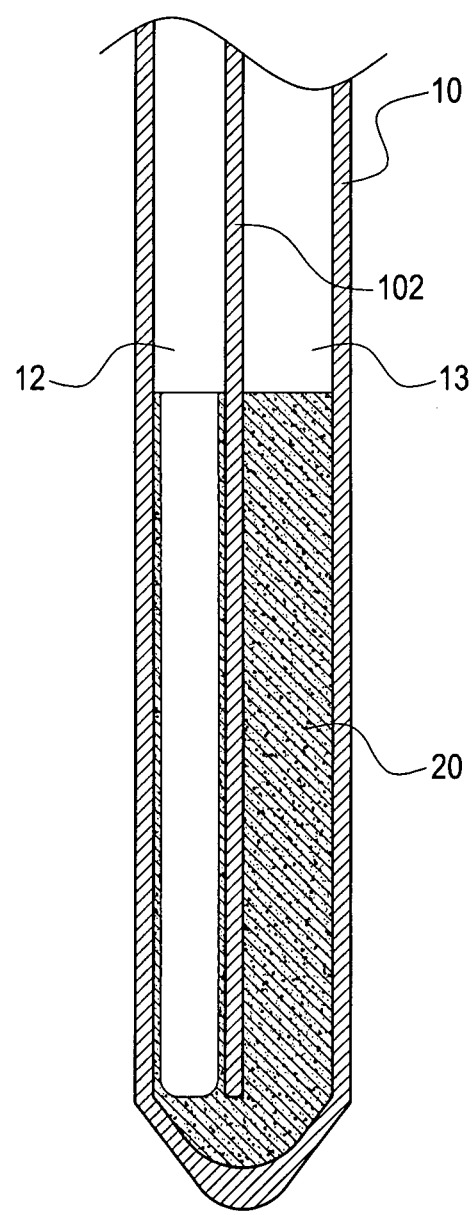
FIG. 6 is a schematic, sectional view of the heat pipe based on the mandrel taken out from the vapor channel.

FIGS. 3 to 5, are respectively, a flowing chart and schematic, sectional views for manufacturing the heat pipe of the present invention. The manufacturing method includes following steps:

a) A metal tube 10 is provided. The metal tube 10 has a vapor channel 12 and a liquid channel 13 communicated with the vapor channel 12 therein (as shown in FIG. 4). In this step, the metal tube 10 is made of a material with good heat-conducting and/or heat-dissipating capabilities, such as copper, etc. The metal tube 10 may be ring-shaped or other different geometrical-shaped. In this step for manufacturing the metal tube 10, two arc-shaped partition boards 101, 102 (as shown in FIG. 2) extend directly from the inner surface of the metal tube 10 with specific mold (not shown). Then the two partition boards 101, 102 are pressed to be deformed plastically by a molding tool, such that the vapor channel 12 and the liquid channel 13 are formed. Furthermore, the front and back ends of the two partition boards 101, 102 are processed by a tool to form a connecting area 14 arranged in the metal tube 10 (as shown in FIG. 4).

b) One end of the metal tube 10 is sealed by a welding device (as shown in FIG. 4). In this step, the bottom of the metal tube 10 is sealed by a welding device, such as welding torch, etc., (not shown).

c) A mandrel 5 is inserted into the vapor channel 12, and a gap 51 is formed between the mandrel 5 and the vapor channel 12 (as shown in FIG. 4). In this step, the outer diameter of the mandrel 5 is less than the inner diameter of the vapor channel 12, and the mandrel 5 is inserted into the vapor channel 12, thus the gap 51 is formed between the outer surface of the mandrel 5 and the inner surface of the vapor channel 12.

d) Metal powder is filled into the gap 51 and the liquid channel 13 (as shown in FIG. 5). In this step, powder made of metal material (not shown) is filled in the gap 51 manufactured in the step c) and the liquid channel 13. The amount of the metal powder is less than the volume of the liquid channel 13 and the gap 51. In this exemplary embodiment, the amount of the metal powder is less than one-third of the volume of the liquid channel 13 and the gap 51. Furthermore, the metal powder is arranged only in the bottom of the gap 51 and the liquid channel 13 for avoiding occupying more space of the metal tube 10.

e) The metal powder is sintered to form the capillary 20 in the vapor channel 12 and the liquid channel 13 (as shown in FIG. 5). In this step, the metal powder is sintered by a sintering process to form the capillary 20 communicated to each other in the bottom of the vapor channel 12 and the liquid channel 13.

f) The mandrel 5 is taken out (as shown in FIG. 6). In this step, the mandrel 5 is shaken to loosen the capillary 20 from the mandrel 5, and then the mandrel 5 is taken out from the vapor channel 12. Thus, the vapor channel 12 of the heat-absorption part 15 is hollow, and the liquid channel 13 of the heat-absorption part 15 is solid to prevent the vapor flowing therethrough.

g) The working fluid 30 is filled in the metal tube 10, and the metal tube 10 is degassed and sealed. In this step, the working fluid 30 is filled in the chamber 11 (as shown in FIG. 1). The metal tube 10 is arranged erectly or slantways, then the working fluid 30, such as pure water, etc., is filled into the chamber 11 of the metal tube 10. The metal tube 10 is degassed by an air extractor, such as heat device. Finally, another opposite end of the metal tube 10 is sealed.

Figure 7:
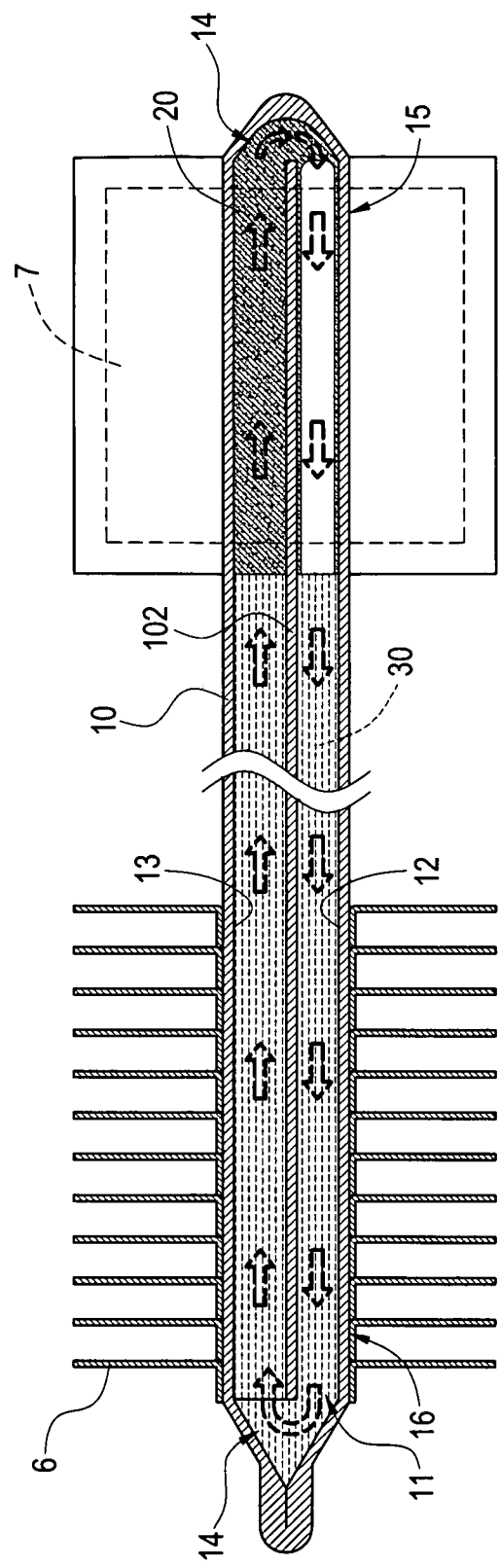
FIG. 7 is a schematic, using-state view of the heat pipe used in an electronic heat-generating element.

FIG. 7 is a schematic, using-state view of the heat pipe of the present invention used in an electronic heat-generating element. The heat-dissipation part 16 is covered with a group 6 of heat-dissipation fins. The heat-absorption part 15 is attached on an electronic heat-generating element 7. When the electronic heat-generating element 7 operates, it will generate large heat to vaporize the working fluid 30. The vaporized fluid takes out the heat by the phase-change, and moves quickly to the group 6 of heat-dissipation fins via the vapor channel 12 since the chamber 11 has a structure configured for preventing the vapor flowing therethrough. The vaporized fluid then enters the front end of the liquid channel 13 via the connecting area 14, and is cooled to be liquid by the group 6 of heat-dissipation fins. The cooled liquid then flows to the capillary 20 by the gas high-low pressure effect or the gravitation effect, and then reflows to the end of the heat pipe attached on the electronic heat-generating element 7 by the capillary force of the capillary 20. Thus the heat pipe operates in circle.

Figure 8:
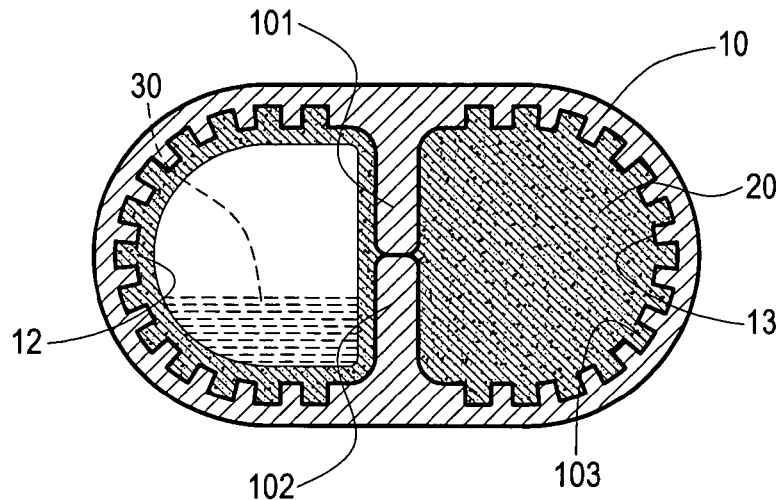
FIG. 8 is a schematic, sectional view of a heat pipe in accordance with another exemplary embodiment of the present invention.
Figure 9:
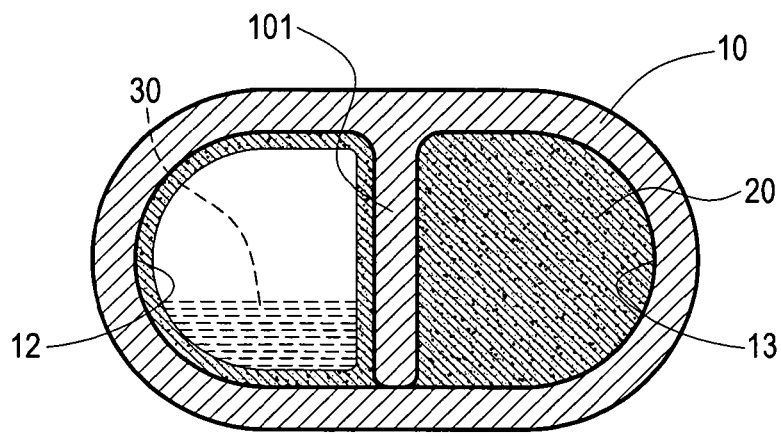
FIG. 9 is a schematic, sectional view of a heat pipe in accordance with other exemplary embodiment of the present invention.
Figure 10:
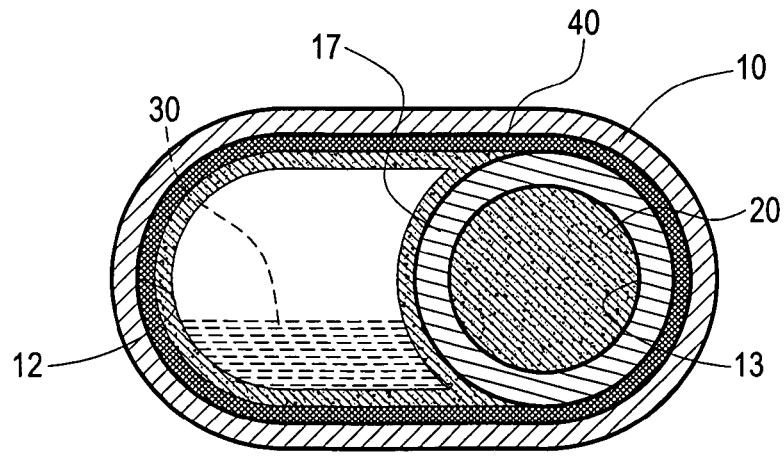
FIG. 10 is a schematic, sectional view of a heat pipe in accordance with other exemplary embodiment of the present invention.

FIGS. 8, 9 and 10, are respective schematic, sectional views of a heat pipe in accordance to other embodiments of the present invention. In FIG. 8, two partition boards 101, 102 are respectively arranged in erectly, and the end faces thereof are jointed together. Furthermore, a plurality of grooves 103 spaced in a same distance with one another, are formed in the inner surface of the metal tube 10 to increase the heat-exchanging area. In FIG. 9, a partition board 101 is arranged in erectly, and the end face thereof is jointed with the inner surface of the metal tube 10. In FIG. 10, a metal net 40 is arranged on the inner surface of the metal tube 10, and a hollow round pole 17 is inserted in the metal tube 10. The outer surface of the pole 17 joints with the inner surface of the metal net, such that the metal net 40 is arranged between the inner surface of the metal tube 10 and the capillary 20 to obtain the same capability described in the above embodiments.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A long-acting heat pipe, comprising:
a metal tube having two sealed ends and a chamber formed in the metal tube;
a partition element formed inside the metal tube to divide the chamber into a vapor channel and a liquid channel communicating with the vapor channel only at the two sealed ends by two connecting areas, respectively;
a heat-absorption part corresponding to a portion of the metal tube to include respective portions of the vapor channel and the liquid channel;
a capillary arranged only in the respective portions of the vapor channel and the liquid channel, wherein the respective portion of the vapor channel is partly filled with the capillary on a periphery of the respective portion of the vapor channel to form a hollow portion in the respective portion of the vapor channel, and the respective portion of the liquid channel is entirely filled with the capillary to form a structure for preventing vapor from flowing through the respective portion of the liquid channel; and
working fluid filling the chamber.

2. The heat pipe as claimed in claim 1, wherein the partition element includes two opposed arc-shaped partition boards extending from an inner surface of the metal tube, each arc-shaped board having an end face, and the end faces of the two partition boards are contacted with each other.

3. The heat pipe as claimed in claim 1, further comprising two opposite erect-shaped partition boards extending from an inner surface of the metal tube, and end faces of the two partition boards jointing together.

4. The heat pipe as claimed in claim 1, further comprising an erect-shaped partition board extending from an inner surface of the metal tube, and an end face of the partition board jointing with the inner surface of the metal tube.

5. The heat pipe as claimed in claim 1, further comprising a hollow pole arranged in the metal tube, parts of an outer surface of the pole jointing with an inner surface of the metal tube.

6. The heat pipe as claimed in claim 1, further comprising a plurality of grooves formed on an inner surface of the metal tube, the plurality of grooves being arranged in the vapor channel and the liquid channel.

7. The heat pipe as claimed in claim 1, wherein the liquid channel is shorter than the vapor channel.

8. The heat pipe as claimed in claim 1, wherein the capillary is made of a porous sintered metal.

9. The heat pipe as claimed in claim 1, further comprising a heat-dissipation part corresponding to another portion of the metal tube.

10. The heat pipe as claimed in claim 1, further comprising a metal net arranged between an inner surface of the metal tube and the capillary.

* * * * *